(12) United States Patent
Ma et al.

(10) Patent No.: US 6,509,622 B1
(45) Date of Patent: Jan. 21, 2003

(54) INTEGRATED CIRCUIT GUARD RING STRUCTURES

(75) Inventors: Qing Ma, San Jose, CA (US); Jin Lee, Palo Alto, CA (US); Quan Tran, San Jose, CA (US); Harry Fujimoto, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 09/644,639

(22) Filed: Aug. 23, 2000

(51) Int. Cl.[7] ............................................. H01L 27/095
(52) U.S. Cl. ..................... 257/483; 438/132; 438/215; 438/601
(58) Field of Search ................. 438/132, 215, 438/601; 364/488, 489, 490

(56) References Cited

U.S. PATENT DOCUMENTS

| | | | |
|---|---|---|---|
| 5,270,256 A | 12/1993 | Bost et al. ................. 437/195 |
| 5,369,595 A | * 11/1994 | Gould et al. ............... 327/565 |
| 5,757,060 A | 5/1998 | Lee et al. ................... 257/529 |
| 5,757,072 A | 5/1998 | Gorowitz et al. ........... 257/700 |
| 5,880,528 A | 3/1999 | Seshan et al. .............. 257/779 |
| 5,977,639 A | 11/1999 | Seshan et al. .............. 257/776 |
| 6,100,118 A | * 8/2000 | Shih et al. .................. 438/132 |

* cited by examiner

Primary Examiner—David Nelms
Assistant Examiner—Mai-Huong Tran
(74) Attorney, Agent, or Firm—Schwegman, Lundberg Woessner & Kluth, P.A (57) ABSTRACT

An integrated circuit including a die having a circuit area and a plurality of guard rings. The circuit area includes active devices, passive devices, and interconnects connected to form an integrated circuit. The plurality of guard rings includes a plurality of stacked guard rings having substantially equal widths and encircling the circuit area. Alternatively, the plurality of guard rings includes metallization level guard rings interleaved with one or more via level guard rings. Each of the one or more via level guard rings includes one or more guard rings encircling the circuit area. Alternatively, the plurality of guard rings includes a plurality of concentric guard rings encircling the circuit area. Each of the plurality of guard rings is fabricated from a metal, such as aluminum, copper, or silver, or an alloy of aluminum, copper, or silver.

22 Claims, 6 Drawing Sheets

INTEGRATED CIRCUIT GUARD RING STRUCTURES

FIELD

The present invention relates to the field of semiconductor fabrication, and more particularly, to integrated circuits with structures that reduce or prevent damage to integrated circuits.

BACKGROUND

An integrated circuit is formed on a die, which is typically a semiconductor substrate. During the manufacture and operation of the integrated circuit, the die is subjected to mechanical stress. As the die is stressed, active devices, passive devices, and interconnects that make up the integrated circuit are also stressed. For example, during the bonding, such as flip-chip bonding, of a die to a substrate the die and the substrate are exposed to heat, which causes the substrate and the die to expand. If the die and the substrate have different coefficients of thermal expansion, the die and the substrate expand at different rates which subjects the die to mechanical stress. The stress may be especially high near the edges and the corners of the die. When the die is stressed, the active devices, the passive devices, and the interconnects formed on the die are also stressed, which may cause a mechanical failure of the devices or the interconnects. One type of mechanical failure that results from mechanical stress applied to a die is the shearing of interconnects. Interconnects generally connect devices, such as active and passive devices, together in the integrated circuit. Shearing the connections between devices in the integrated circuit causes catastrophic failure of the integrated circuit.

For some types of integrated circuits that will be developed in the next generation of integrated circuits, the dielectric surrounding each interconnect will be a high strength material, such as an oxide. For these types of integrated circuits, catastrophic failure of the integrated circuit from mechanical stress may remain relatively small. However, for many types of next generation integrated circuits, such as processors, the interconnects will be fabricated from high conductivity materials, such as copper, embedded in low strength dielectric materials, such as low-K materials. For these types of integrated circuits, stress induced catastrophic failures, such as interconnect shearing, will most likely increase.

For these and other reasons, there is a need for the present invention.

DESCRIPTION

Figure 1A:
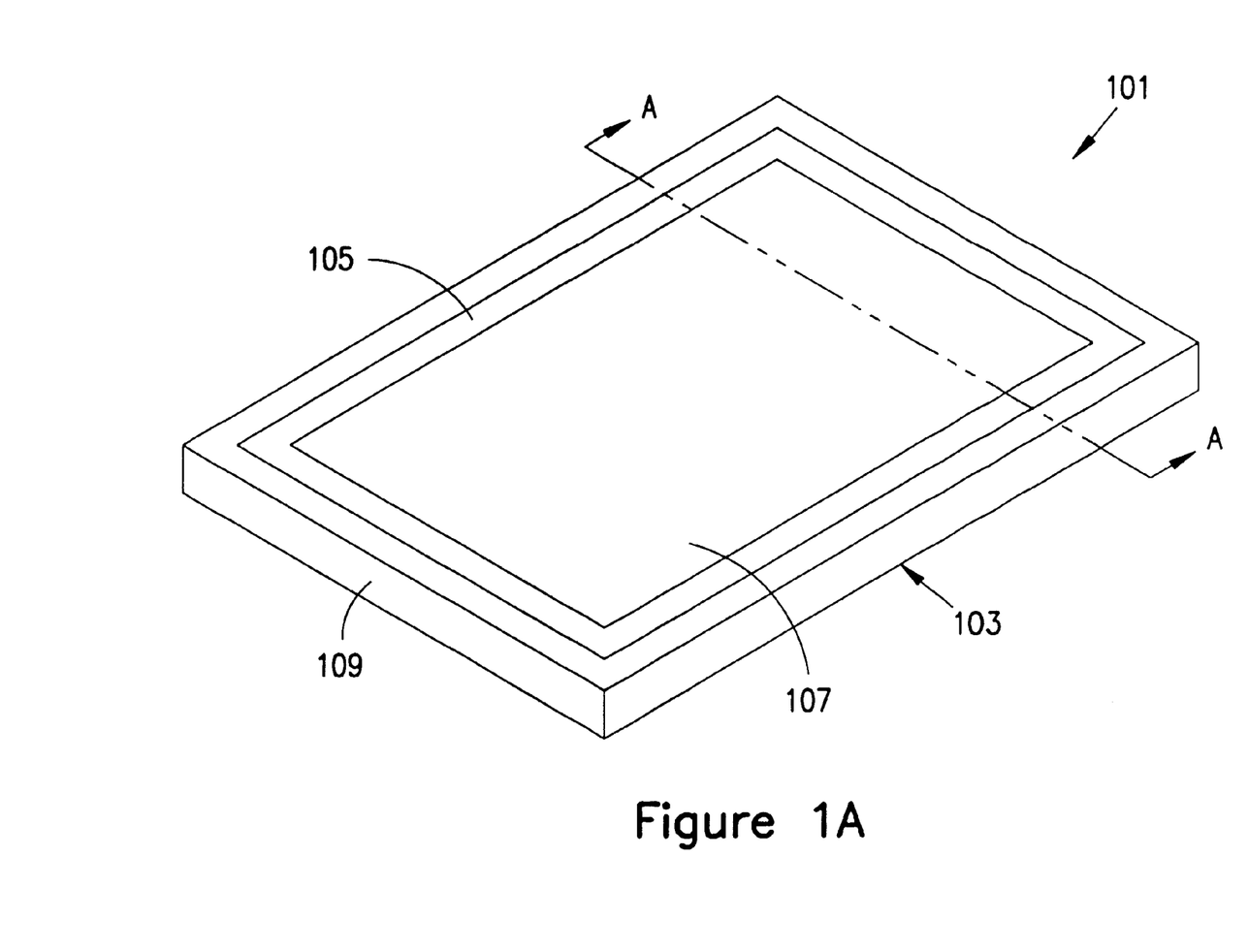
FIG. 1A is a perspective view of one embodiment of an integrated circuit, including a guard ring structure, of the present invention.

FIG. 1 is a perspective view of one embodiment of an integrated circuit 101 comprising a die 103 and a guard ring structure 105. Die 103 includes a circuit area 107 and an outer edge 109. Guard ring structure 105 preferably separates outer edge 109 from circuit area 107. Circuit area 107 is generally located within guard ring structure 105 and is preferably encircled by guard ring structure 105.

Integrated circuit 101 is generally a complex circuit. For example, integrated circuit 101 may be a processor, such as a microprocessor, or an application specific integrated circuit (ASIC), such as a circuit tailored specifically to the needs of the telecommunications industry, the automotive industry, or the aerospace industry. Integrated circuit 101, in the present invention, is not limited to a particular type of circuit or to being manufactured using a particular fabrication process. Analog circuits, digital circuits, and mixed-signal circuits are all suitable for use in connection with the present invention. The analog circuits, digital circuits, or mixed-signal circuits that make up integrated circuit 101 may be fabricated using any integrated circuit fabrication process or combination of integrated circuit fabrication processes. For example, integrated circuit 101 may be fabricated using a single process, such as a complementary metal-oxide semiconductor (CMOS) process or a bipolar process, or using a bipolar process and a CMOS process in combination.

Die 103 includes a substrate and a circuit area 107. The die is typically fabricated from a semiconductor, and integrated circuit structures, such as active devices, passive devices, and interconnects, are formed in circuit area 107. Active devices used in the fabrication of integrated circuits generally include diodes and transistors. Passive devices used in the fabrication of integrated circuits generally include resistors and capacitors. Interconnects used in the fabrication of integrated circuit 101 include interconnects fabricated from materials such as aluminum, silver, or copper, or alloys of aluminum, silver, or copper. One exemplary alloy suitable for use in connection with the present invention is tungsten-aluminum. Generally, the interconnects are embedded in a dielectric, such as an oxide or a low-K dielectric, such as xerogel. The formation of devices in circuit area 107 includes the formation of devices and interconnects that are diffused, implanted, deposited, or otherwise formed within or above the substrate. Exemplary semiconductor materials suitable for use as a substrate in the fabrication of die 103 include materials such as silicon, germanium, and gallium arsenide.

Figure 1B:
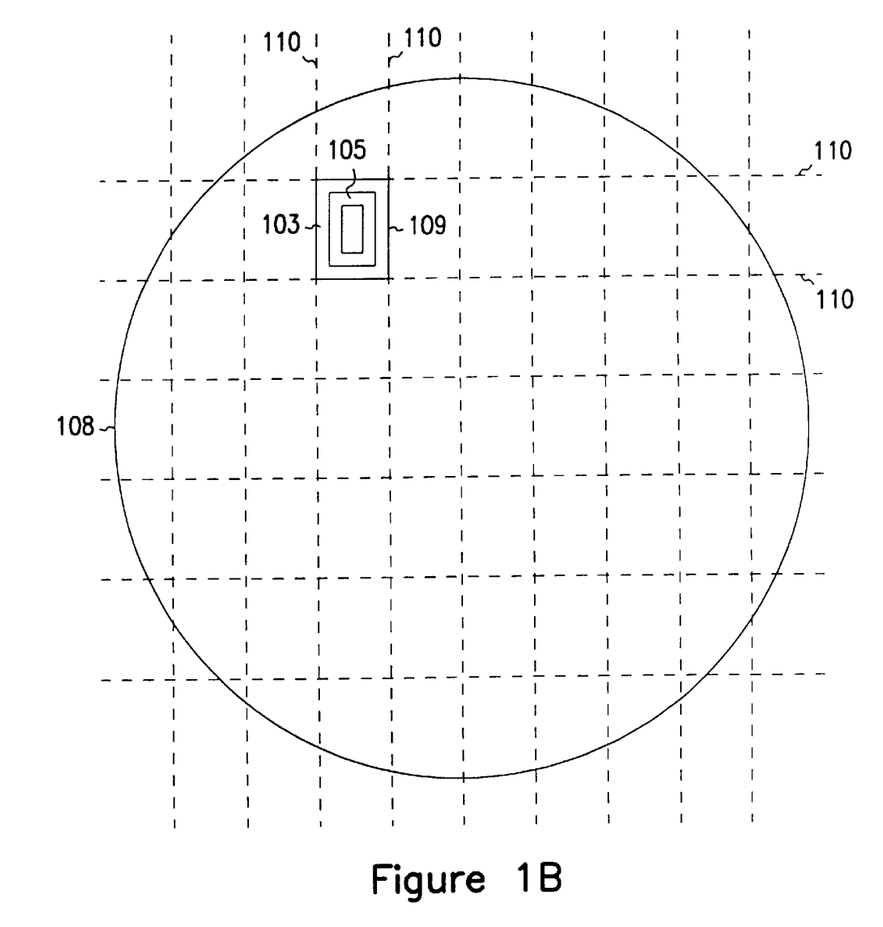
FIG. 1B is a top view of one embodiment of a wafer having a die formed thereon.

Circuit area 107 is located on die 103 and is generally surrounded or encircled by guard ring structure 105. Circuit area 107 is the area of die 103 on which electronic devices, such as transistors, diodes, resistors and capacitors are formed and interconnected to form integrated circuit 101. Generally, circuit area 107 does not extend into the area of die 103 which is proximate to outer edge 109. During the manufacture of die 103, a wafer, generally a thin slice of a single crystal of a semiconductor such as silicon, germanium or gallium arsenide, on which die 103 is fabricated, is partitioned and sliced into a number of pieces known as dice. FIG. 1B is a top view of one embodiment of a wafer 108 having die 103 formed thereon. In practice, a number of dice are formed on wafer 108. A dicing process includes slicing wafer 108 along the outside edge 109 of die 103. The dicing process separates die 103 from wafer 108. Dicing occurs along lines 110. During the dicing of wafer 108, outside edge 109 of die 103, is mechanically stressed. This stress can create cracks in the outside edges of the die 103 and can damage electronic devices or interconnects which the cracks intersect. To avoid damage from cracks, circuit area 107 is fabricated at a distance of about 5 microns from outside edge 109. To prevent cracks from propagating into circuit area 107, guard ring structure 105 is formed to encircle circuit area 107.

Figure 2:
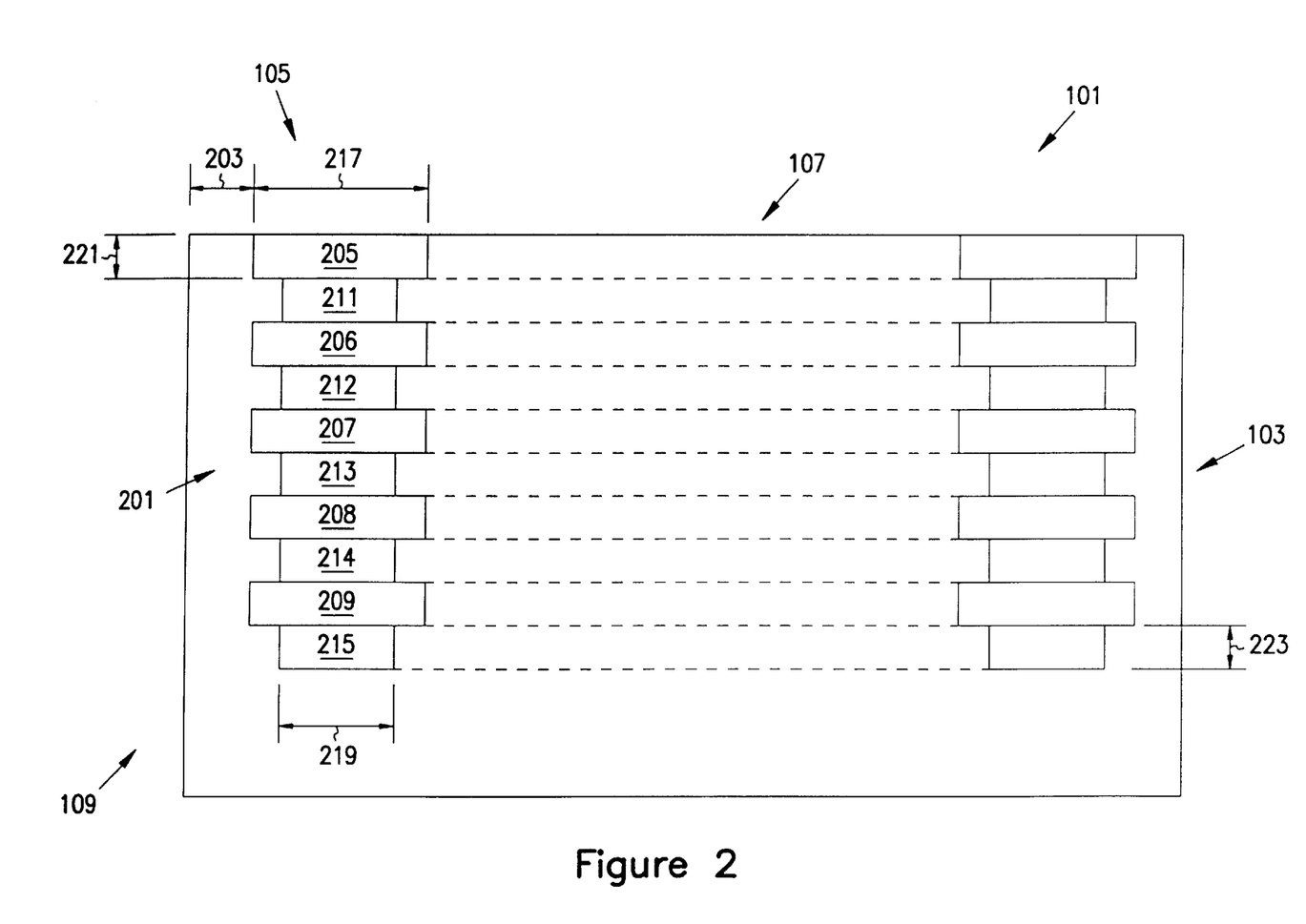
FIG. 2 is a cross-sectional view taken along line A–A' of the integrated circuit of FIG. 1 showing a cross-sectional view of one embodiment of a guard ring structure of the present invention.

FIG. 2 is a cross-sectional view of integrated circuit 101 of FIG. 1 taken along line A–A' of FIG. 1 showing a cross-sectional view of one embodiment of a guard ring structure 105 of the present invention. Guard ring structure 105 is preferably fabricated from a material having a high shear strength. Guard ring structure 105 shown in FIG. 2 comprises a plurality 201 of guard rings 205–209 and 211–215. The plurality 201 of guard rings are preferably located at distance 203 of about 5 microns from outer edge 109 of die 103. Locating the plurality 201 of guard rings at a distance of less than about 5 microns from outer edge 109 of die 103 increases the likelihood that the guard ring structure 105 will be damaged during the dicing of die 103. Locating the plurality of guard rings 201 at a distance of more than about 5 microns unnecessarily decreases the size of circuit area 107.

The plurality 201 of guard rings includes a plurality of metal level guard rings 205–209, and one or more via level guard rings 211–215 alternating with the metal level guard rings 205–209 to form the plurality 201 of guard rings. A metal level guard ring is a guard ring formed on and coplanar with a metallization level of an integrated circuit. An integrated circuit may include one or more metallization levels for routing signals within the integrated circuit. Metal level guard rings 205–209 are guard rings fabricated on metallization levels of integrated circuit 101. A via level guard ring is a guard ring formed on and coplanar with a via level of an integrated circuit. An integrated circuit may include one or more via levels usually formed from dielectric materials and located between metallization levels. Via levels include conductive structures for interconnecting conductive structures on different metallization levels. Via level guard rings 211–215 are fabricated on via levels of integrated circuit 101.

Each of the plurality of metal level guard rings 205–209 has a width 217, and each of the one or more via level guard rings 211–215 has a width 219. In one embodiment of the present invention, the width 217 and the width 219 are substantially equal, although their widths are depicted as unequal in FIG. 2 for purposes of clarity. The width 217 is preferably between about 20 microns and about 50 microns. In general, the larger the width 217, the better the protection provided by the plurality of guard rings 201 to circuit area 107. Each of the plurality of metal level guard rings 205–209 has a thickness 221, and each of the one or more via level guard rings 211–215 has a thickness 223. In general, the metal level guard rings 205–209 are formed on die 103 at the same time that the metallization levels are formed in circuit area 107, so the thickness 221 is substantially the same as the thickness of the metallization levels in circuit area 107. In general, the via level guard rings 211–215 are formed on die 103 at the same time that the via level metallization is formed in circuit area 107, so the thickness 223 of each of the one or more via level guard rings is substantially the same as the thickness of the via levels in circuit area 107.

The plurality 201 of guard rings is generally fabricated from a material having a high shear strength. In one embodiment, a high density material, such as a metal, is suitable for use in the fabrication of the plurality 201 of guard rings. More specifically, metal level guard rings 205–209 are preferably fabricated from a metal. In one embodiment of the present invention, metal level guard rings 205–209 are fabricated from aluminum. In an alternate embodiment, metal level guard rings 205–209 are fabricated from an aluminum alloy. Via level guard rings 211–215 are preferably fabricated from a metal. In one embodiment of the present invention, via level guard rings 211–215 are fabricated from tungsten. In an alternate embodiment, via level guard rings 211–215 are fabricated from a tungsten alloy.

Figure 3:
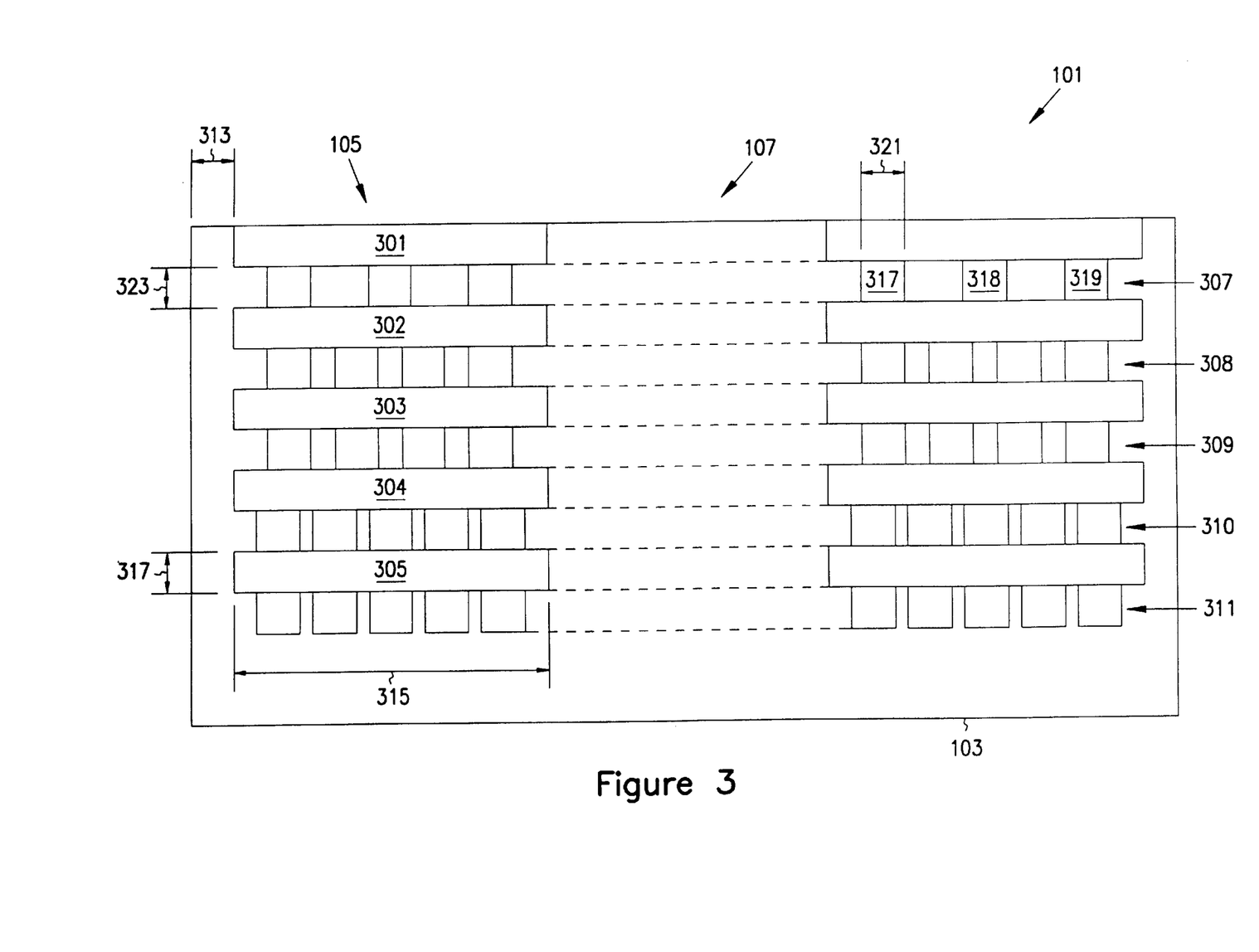
FIG. 3 is a cross-sectional view taken along line A–A' of the integrated circuit of FIG. 1 showing a cross-sectional view of an alternate embodiment of a guard ring structure of the present invention.

FIG. 3 is a cross-sectional view of the integrated circuit 101 of FIG. 1 taken along line A–A' showing a cross-sectional view of an alternate embodiment of the guard ring structure 105 of the present invention. Guard ring structure 105 shown in FIG. 3 comprises a plurality of guard rings 301–305 and one or more guard ring structures 307–311 interleaved with the plurality of guard rings 301–305. The plurality of guard rings 301–305 are preferably located at distance 313 of about 5 microns from outer edge 109 of die 103. Locating the plurality of guard rings 301–305 at a distance of less than about 5 microns from outer edge 109 of die 103 increases the likelihood that the guard ring structure will be damaged during the dicing of die 103. Locating the plurality of guard rings 301–305 at a distance of more than about 5 microns unnecessarily decreases the size of circuit area 107.

Each guard ring of the plurality of guard rings 301–305, which are typically metal level guard rings, is preferably fabricated from a high shear strength material. In one embodiment, each of the plurality of guard rings 301–305 is fabricated from a metal such as aluminum, silver, or copper, or an aluminum alloy, a copper alloy, or a silver alloy. Each of the plurality of metal level guard rings 301–305 has a width 315 preferably between about 20 microns and about 50 microns. In one embodiment of the present invention, the width of each of the plurality of guard rings 301–305 are substantially equal. Each of the plurality of metal level guard rings 301–305 has a thickness 317 preferably between about 3 microns and about 5 microns.

Each of the one or more guard ring structures 307–311 interleaved with the plurality of guard ring structures 301–305 includes one or more guard ring substructures, such as substructures 317–319, formed on via levels of integrated circuit 101. The substructures 317–319 are separated, concentric rings. Each of the substructures 317–319 has a width 321, preferably between about 3 microns and about 6 microns. In one embodiment of the present invention, the widths of the substructures in each of the one or more guard ring structures 307–311 are substantially equal. However, the present invention is not limited to substructures having equal widths in each of the one or more guard ring structures 307–311. In general, the one or more via level guard ring structures 307–311 are formed on die 103 at the same time that the via level metallization is formed in circuit area 107, so the thickness 323 of each of the one or more via level guard rings is substantially the same as the thickness of the via levels in circuit area 107. In one embodiment of the present invention, the thickness 323 is preferably between about 3 microns and about 5 microns.

The one or more guard ring structures 307–311 are generally fabricated from a high shear strength material, such as a metal. In one embodiment of the present invention, the one or more guard ring structures 307–311 are fabricated from tungsten. In an alternate embodiment, the one or more guard ring structures 307–311 are fabricated from tungsten alloy. It should be noted that the plurality of guard rings 301–305 may be fabricated from a different material than the one or more guard ring structures 307–311.

Figure 4:
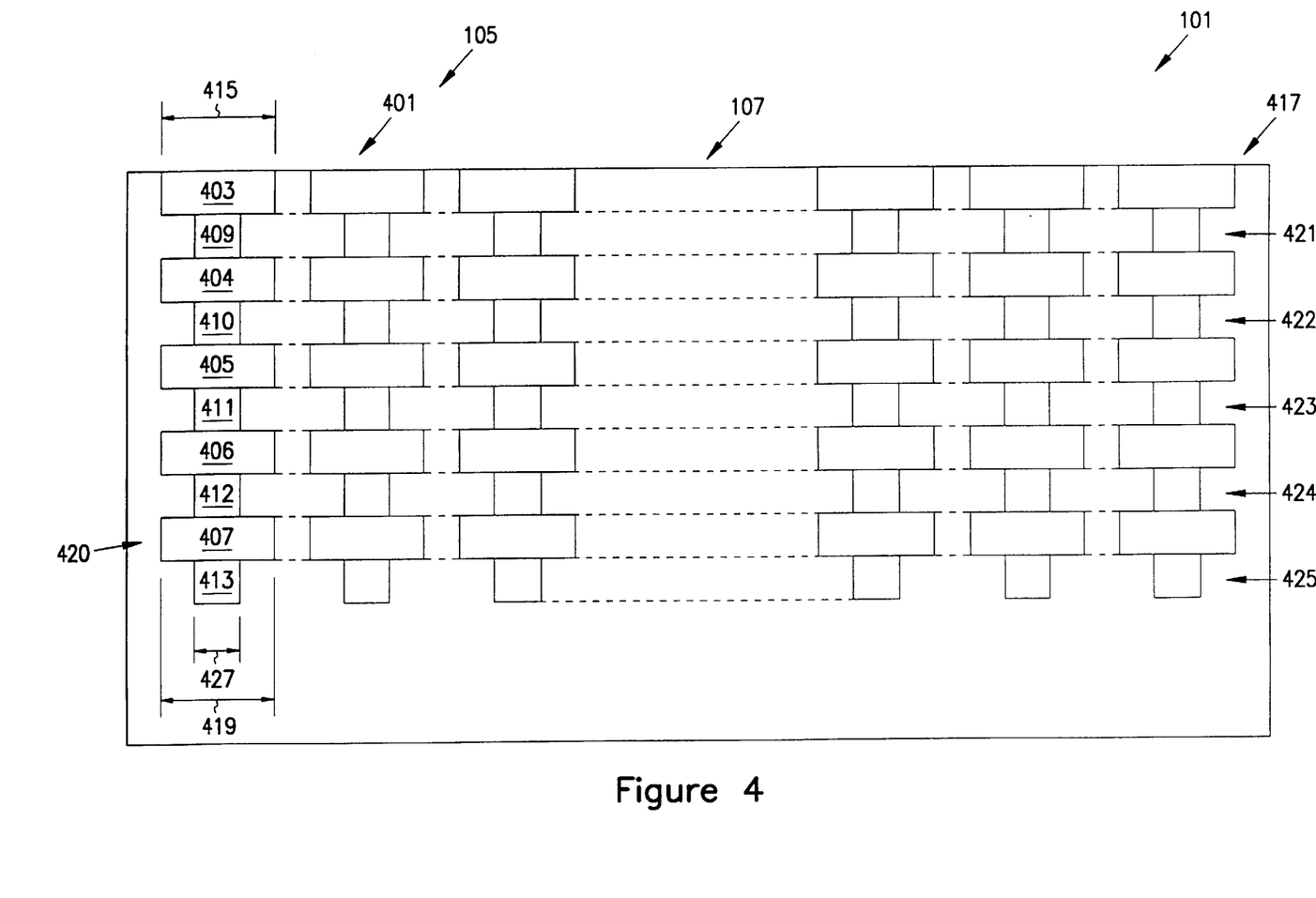
FIG. 4 is a cross-sectional view taken along line A–A' of the integrated circuit of FIG. 1 showing a cross-sectional view of a second alternate embodiment of a guard ring structure of the present invention.

FIG. 4 is a cross-sectional view of the integrated circuit 101 of FIG. 1 taken along line A–A' showing a cross-sectional view of a second alternate embodiment of the guard ring structure 105 of the present invention. The second alternate embodiment of guard ring structure 105 comprises a plurality of concentric guard rings 401. Each of the plurality of concentric guard rings 401 comprises a plurality of metal level guard rings 403–407 and one or more via level guard rings 409–413. The metal level guard rings are interleaved with the via level guard rings. Each one of the plurality of concentric guard rings 401 provides protection from shear stresses to circuit area 107.

Each of the plurality of metal level guard rings 403–407 is preferably formed on a metallization level of integrated circuit 101. In one embodiment of the present invention, each of the plurality of metal level guard rings 403–407 has a width substantially equal to the width of the line widths of the interconnects formed on the metallization level that the metal level guard rings are formed on. For example, width 415 of metal level guard ring 403 is about equal to the line widths of the interconnects formed on fifth metallization level 417 of integrated circuit 101. Width 419 of metal level guard ring 407 is about equal to the line widths of the interconnects formed on first metallization level 420 of integrated circuit 101. In one embodiment, width 415 is about equal to 20 microns and width 419 is equal to about 5 microns.

Each of the plurality of via level guard rings 409–413 is preferably formed on a via level of integrated circuit 101. In one embodiment, integrated circuit 101 has five levels 421–425. In one embodiment of the present invention, each of the plurality of via level guard rings 409–413 preferably has a width about equal to or slightly less than the metallization guard ring width formed directly above. For example, width 427 of via level guard ring 413 is about equal to width 419 of metallization level guard ring 407 although their widths are depicted as unequal in FIG. 4 for purposes of clarity. In one embodiment, width 419 is about equal to 17 microns and width 427 is about equal to 3 microns.

The plurality of concentric guard rings 401 are generally fabricated from a conductive material, such as a metal. Each of the plurality of concentric guard rings 401 may be fabricated from a different material, but in general, each of the plurality of metal level guard rings is fabricated form one material and each of the plurality of via level guard rings is fabricated from one material. In one embodiment of the present invention, each of the plurality of metal level guard rings 403–407 is fabricated from aluminum. In an alternate embodiment, each of the plurality of metal level guard rings 403–407 is fabricated from an aluminum alloy, such as aluminum-silicon or aluminum-copper. In one embodiment, each of the plurality of via level guard rings 409–413 fabricated from tungsten. In an alternate embodiment, each of the plurality of via level guard rings 409–413 is fabricated from a tungsten alloy. In still another alternate embodiment, each of the plurality of concentric guard rings 401 is fabricated from copper or a copper alloy. It should be noted that each of the plurality of metal level guard rings 403–407 may be fabricated from a different material than the via level guard rings 409–413.

Referring again to FIG. 1, since guard ring structure 105 encircles circuit area 107 and separates circuit area 107 from outside edge 109 of die 103, a shear stress applied to outside edge 109 is applied to guard ring structure 105. The stresses may arise during the dicing of die 103 or during the thermal expansion or contraction of die 103. Guard ring structure 105 absorbs the applied stress, and thereby prevents shearing and damage to active devices, passive devices, and interconnects formed in circuit area 107. Alternate embodiments of guard rings 105 are shown in FIGS. 2–4 and described above.

Figure 5:
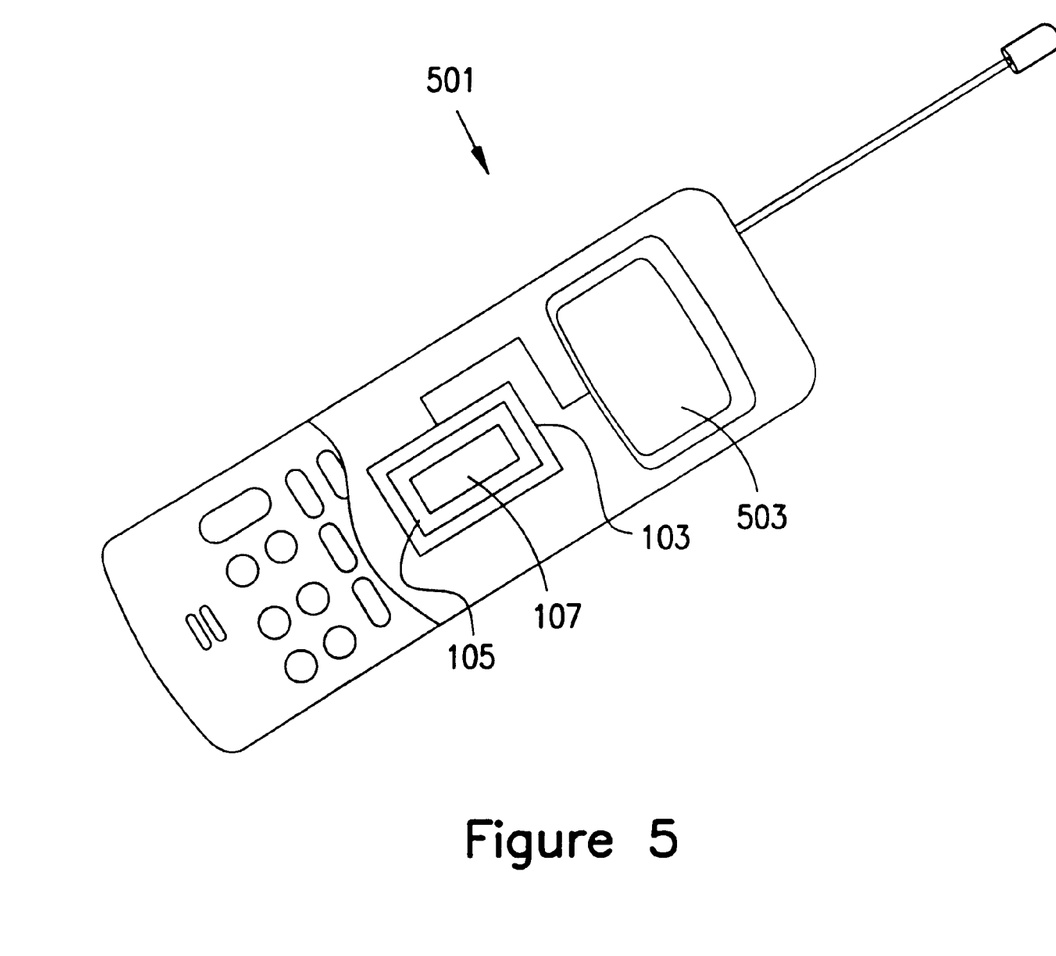
FIG. 5 is a perspective view of a communication device suitable for use in connection with the present invention.

FIG. 5 is an illustration of computerized device 501 suitable for use in connection with the present invention. Computerized device 501 includes die 103 having a circuit area 107 encircled by a plurality of guard rings 105. In one embodiment, circuit area 107 includes a microprocessor coupled to a display 503. Display 503 is any display capable of being coupled to a microprocessor. While display 503, in one embodiment, may be a cathode ray tube display, in other embodiments, display 503 may be a liquid crystal display. Computerized device 501 is not limited to a particular type of computerized device. In one embodiment, computerized device 501 is a hand-held video display device. In an alternate embodiment, computerized device 501 is a portable communication device.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. An integrated circuit comprising:
   a die having a circuit area; and
   a plurality of guard rings having substantially equal widths, the plurality of guard rings being arranged in a stack encircling the circuit area.

2. The integrated circuit of claim 1, wherein the die comprises a semiconductor.

3. The integrated circuit of claim 2, wherein the circuit area comprises a processor.

4. The integrated circuit of claim 3, wherein the processor includes a low-k dielectric.

5. The integrated circuit of claim 4, wherein the low-k dielectric comprises xerogel.

6. The integrated circuit of claim 1, wherein the plurality of guard rings comprise a copper alloy.

7. The integrated circuit of claim 1, wherein at least one of the plurality of guard rings is a metal level guard ring having a width of about 50 microns.

8. The integrated circuit of claim 1, wherein the die has an outer edge and the guard ring is formed at a distance of about 5 microns from the outer edge.

9. An integrated circuit comprising:
   a die having a circuit area;
   a plurality of stacked guard rings having substantially equal widths; and
   one or more guard ring structures interleaved with the plurality of stacked guard rings, each one of the one or more guard ring structures comprising a plurality of guard rings encircling the circuit area.

10. The integrated circuit of claim 9, wherein the die comprises gallium arsenide.

11. The integrated circuit of claim 10, wherein the circuit area comprises an application specific integrated circuit.

12. The integrated circuit of claim 9, wherein the plurality of guard rings comprises an aluminum alloy.

13. An integrated circuit comprising:
   a die having a circuit area; and
   a plurality of concentric guard rings formed on the die, each of the plurality of concentric guard rings encircling the circuit area.

14. The integrated circuit of claim 13, wherein the die comprises silicon.

15. The integrated circuit of claim 14, wherein the circuit area comprises a digital signal processor.

16. The integrated circuit of claim 13, wherein each of the plurality of concentric guard ring structures comprise:
   a plurality of metal level guard rings; and
   one or more via level guard rings vertically aligned with the plurality of metal level guard rings.

17. The integrated circuit of claim 16, wherein the plurality of metal level guard rings comprise a copper alloy.

18. The integrated circuit of claim 16, wherein the one or more via level guard rings comprise an aluminum alloy.

19. The integrated circuit of claim 13, wherein each of the plurality of concentric guard ring structures has a rectangular shape.

20. A computerized device comprising:
   a die having a processor area;
   a plurality of stacked guard rings formed on the die; and
   one or more guard ring structures interleaved with the plurality of stacked guard rings, each one of the one or more guard ring structures comprising a plurality of guard rings encircling the circuit area; and
   a display coupled to the processor.

21. The computerized device of claim 20, wherein the die has one or more metallization levels and each of the plurality of stacked guard rings is formed on one of the one or more metallization levels.

22. The computerized device of claim 20, wherein the die has a via level and one or more guard ring structures is formed on a via level.

* * * * *